United States Patent [19]
Harvilchuck et al.

[11] 3,994,793
[45] Nov. 30, 1976

[54] REACTIVE ION ETCHING OF ALUMINUM
[75] Inventors: Joseph M. Harvilchuck, Billings; Joseph S. Logan, Poughkeepsie; William C. Metzger, Beacon; Paul M. Schaible, Poughkeepsie, all of N.Y.
[73] Assignee: International Business Machines Corporation, Armonk, N.Y.
[22] Filed: May 22, 1975
[21] Appl. No.: 580,102

[52] U.S. Cl. ................................ 204/192; 156/8; 156/22; 204/164
[51] Int. Cl.$^2$ .............. C23C 15/00; B01K 1/00; C23F 1/00
[58] Field of Search .............. 204/192, 298, 164; 156/8, 17, 21, 22; 134/1

[56] References Cited
UNITED STATES PATENTS

| 3,477,936 | 11/1969 | Gillery et al. ............... 204/192 |
| 3,615,956 | 10/1971 | Irving et al. ................ 156/17 |
| 3,654,108 | 4/1972 | Smith, Jr. ................... 204/164 |
| 3,676,317 | 7/1972 | Harkins, Jr. et al. ........ 204/192 |
| 3,795,557 | 3/1974 | Jacob ......................... 156/8 |
| 3,847,776 | 11/1974 | Bourdon et al. ............. 204/192 |
| 3,867,216 | 2/1975 | Jacob ......................... 156/2 |
| 3,880,684 | 4/1975 | Abe ............................ 156/8 |
| 3,951,709 | 4/1976 | Jacob ......................... 156/8 |

OTHER PUBLICATIONS
N. Hosokawa et al., "RF Sputter-Etching by Fluor-Chloro-Hydrocarbons," 6th Int'l. Vacuum Congress, Japan, Mar. 25–29, 1974.

Primary Examiner—John H. Mack
Assistant Examiner—Aaron Weisstuch
Attorney, Agent, or Firm—Wolmar J. Stoffel

[57] ABSTRACT

A process for etching aluminum wherein a masked layer of aluminum, supported on a substrate, is exposed to a plasma formed by imposing an RF voltage across at least two spaced electrodes in an ambient including a gas selected from the group consisting of $CCl_4$, $Cl_2$, $Br_2$, HCl. The resultant conditions provide a reactive environment where the aluminum is bombarded with chlorine or bromine ions. The aluminum reacts with chlorine or bromine ions to form an aluminum chloride or bromide compound, which is volatile at the temperature of the sputtered substrate.

9 Claims, 2 Drawing Figures

REACTIVE ION ETCHING OF ALUMINUM

DESCRIPTION OF THE PRIOR ART

This invention relates to sputter etching, more particularly to a method for reactive ion etching of an aluminum film supported on a substrate, typically a semiconductor body.

High density integrated circuits require metal interconnection systems with sufficient current carrying capacity to resist electromigration under current loads. Of necessity, the lines must be closely spaced in order to achieve the desired pattern density. The lines must be relatively thick to attain cross-sectional areas. The requirement for relatively thick interconnection patterns is particularly true when the interconnection metal is aluminum. If the volume of the stripes of the metallurgy pattern is not sufficiently great, heating and subsequently electromigration problems may develop.

In the past, the metallurgy patterns were produced by depositing a blanket layer of metal, masking the metal with a photoresist layer, developing the photoresist layer and subsequently etching the exposed metal layer portions with a suitable metal echant. However, in high density integrated circuits with the relatively thick metal layer, the desired cross-sectional area required for current carrying capacity could not be achieved by conventional subtractive etching. In such etching techniques, the etchant etches horizontally as well as vertically. This resulted in sloping sidewalls on the metallurgy pattern which materially reduces the cross-sectional area and thus the volume of the metallurgy stripe. Also, the horizontal etching limits the minimum width of a line that may be etched before the horizontal etching will cause a detachment of the mask layer from the metal.

Other fabrication techniques for avoiding the aforementioned problem have been proposed. One potential solution was the use of a lift-off process for fabricating the metallurgy pattern. In this technique, a photoresist layer is deposited over the insulating layer on a silicon substrate, the reverse pattern exposed and developed in the resist, and subsequently a blanket layer of metal deposited over the resist. When the resist is removed by a suitable etchant, it removes the overlying metal pattern leaving the desired pattern that is adherent to the insulating layer. However, this process is complex, imposes a temperature limitation on the deposition of the functional metal, and is subject to residue problems which contribute contact resistance between metal layers.

Another technique for fabricating interconnection metallurgy patterns is sputter etching. Sputter etching methods and apparatus for sputter etching are described in U.S. Pat. No. 3,598,710, U.S. Pat. No. 3,617,463, and in IBM, TDB, Vol. 7, No. 4, October 1974, pages 364, 365 and 366. In sputter etching, vertical walls can be obtained on the metallurgy stripes. This process, unlike subtractive etching wherein tapered sidewalls are produced, can be used to obtain fine pattern definition. The process works well with many types of conductive metals. However, the use of sputter etching in general for aluminum metal is not satisfactory because the metal sputters very slowly. This slow sputtering rate is time consuming and expensive, and requires thick masking layers. The advantage gained by sputtering straight sidewall patterns is frequently lost because of the lack of definition of the masking patterns due to the thickness required in order to be effective. In general, sputter etching techniques utilize an environment of an inert gas. However, reactive ion etching has been suggested for removing photoresist materials, as for example in U.S. Pat. No. 3,806,365. In this suggested technique, a mixture of at least two organo halides as the sputtering environment is suggested. However, these suggested organo halides are not effective in reactive etching of aluminum. The same relatively slow rates are exhibited as in the use of an inert gas.

SUMMARY OF THE INVENTION

An object of this invention is to provide a sputtering method wherein a new gaseous environment for reactive ion etching of aluminum is used.

Yet another object of this invention is to provide a method for etching aluminum at relatively high reactive ion etch rates.

In accordance with the aforementioned objects, there is presented a process for reactive ion etching of aluminum wherein a masked layer of aluminum supported on a substrate is exposed to an RF plasma formed by imposing an RF voltage across at least two spaced electrodes in a gaseous environment composed of an inert gas and a gas selected from the group consisting of $CCl_4$, $Cl_2$, $Br_2$, and $HCl$.

BRIEF DESCRIPTION OF THE DRAWINGS

Still other and further objects, features and advantages of the invention will become more apparent from the following more particular description of preferred embodiments of the invention illustrated in the accompanying drawings.

DESCRIPTION OF THE PREFERRED EMBODIMENTS

Figure 1:
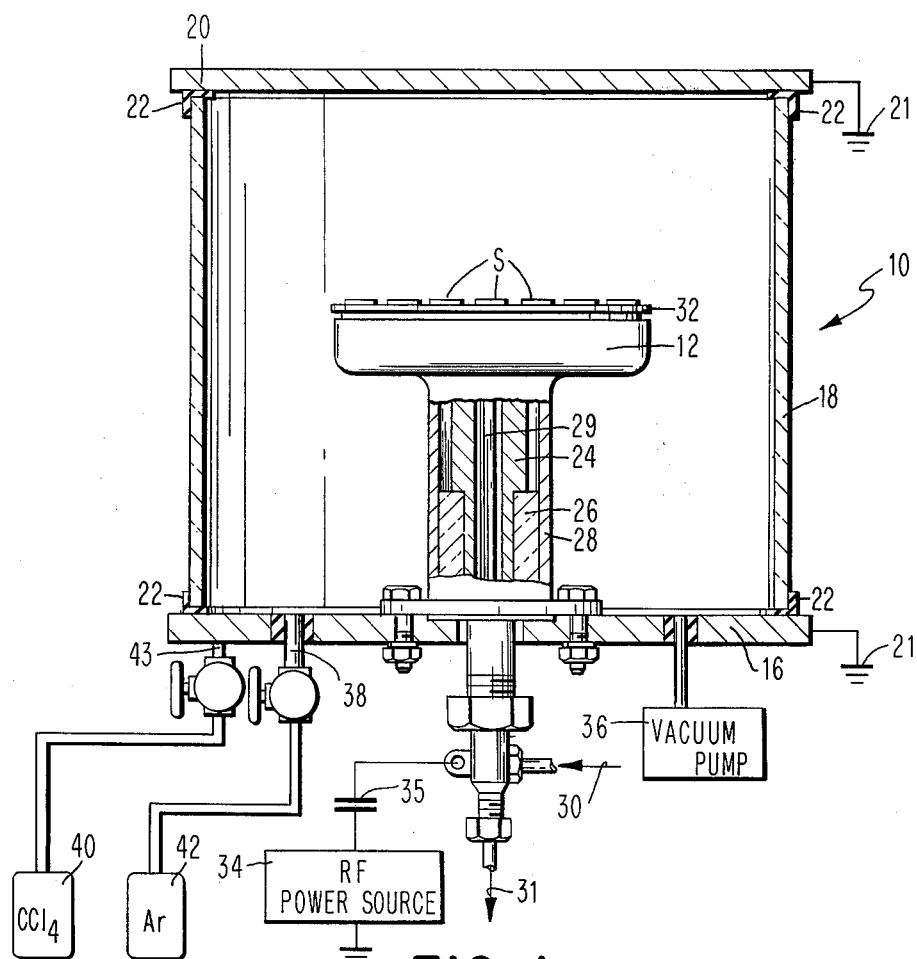
FIG. 1 is an elevational view in cross section illustrating a preferred reactive ion etching apparatus for practicing the method of the invention.

Radio frequency sputtering systems, both for the deposition of films, and for the etching of objects and films, take advantage of the characteristic difference in electron and ion mobility. The frequency of the RF potential applied is greater than the plasma ion resonance frequency in the glow space, and lower than the plasma electron resonance frequency. Ion sheaths, commonly referred to as dark spaces, form next to the electrodes. To a first approximation, the glow space is at uniform potential and the potential differences between the electrodes are taken across the dark spaces. Further, the glow space of the discharge is capacitively coupled through the dark spaces to the electrodes and it is always more positive in potential than either electrode surface. Thus, in sputter deposition, during the portion of the cycle that the target electrode is biased negatively, positive ions are drawn across the dark space adjacent the target to bombard the target. The ions cause ejection of atoms from the target which deposit on surrounding surfaces, particularly the element being coated, which is supported near the target. In sputter etching, during the portion of the cycle that the electrode supporting the object to be etched is biased negatively, positive ions are drawn across the dark space adjacent the electrode to bombard and erode the object. In the second part of the cycle, electrons are attracted toward the respective target or object being etched to neutralize any build up of charge. By varying the physical arrangement of the RF source and electrodes, the spacing and dimension of the electrode, the desired phenomenon, i.e. deposition or etching, can be caused to take place and can be optimized.

It is known in depositing films to provide elements in the sputtering ambient that will react with the material of the cathode to form compounds which can be deposited on substrates strategically placed within the sputter apparatus. By using this technique, dielectric films can be deposited at significantly fast rates and at more uniform compositions. Reactive ion etching has been used for selectively etching certain materials, as for example the etching of organic material as disclosed in U.S. Pat. No. 3,816,198.

In the fabrication of semiconductor devices, a very popular metal for forming the interconnection metallurgy systems is aluminum. Aluminum has a number of advantages, i.e. it adheres directly to most dielectric materials, it forms an ohmic contact directly with the silicon or other semiconductor material, it is easy to deposit, and it is relatively inexpensive. However, aluminum has a disadvantage in that under heavy current loading, the metal is prone to electro-migration. The use of aluminum alloys, such as AlCu, have alleviated this problem to a certain extent. Therefore, in the use of aluminum, it is important that the metallurgy have sufficient cross-sectional area to avoid heating. In high density integrated circuit applications in order to utilize the surface of the device to its fullest extent, the metallurgy stripe is preferably formed to a thickness in the range of 5,000 Angstroms to 30,000 Angstroms. In high density applications, it is important that the stripes be spaced as closely as possible, frequently with the spacing in the range of 50 to 500 micro-inches. The use of subtractive chemical etching results in metallurgy stripes having sloping sidewalls. With sloping sidewalls, the cross-sectional area of the stripe is significantly less than if the stripes had vertical sidewalls. Also, horizontal etching limits the maximum thickness to width ratio which may be achieved before the horizontal etching will cause a detachment of the mask layer from the metal. One method of achieving vertical sidewalls is by sputter etching. However, conventional sputter etching of aluminum in an inert gas atmosphere is time consuming and expensive, since the aluminum sputters at a very slow rate, on the order of 15 Angstroms per minute at a power density of 0.2W cm$^{-2}$. When the power density is increased, the sputter etch rate is increased, but the temperature of the substrate also increases. This imposes an upper sputter etching rate since the substrate temperature cannot exceed the melting temperature of aluminum, Also, an even lower temperature limit is imposed by the use of organic masks which degrade at relatively low temperatures.

In this reactive ion etching operation, a gas is introduced which forms a reactive ion species which is then directed to the substrate where it reacts with the aluminum layer to form a volatile or easily sputtered compound. This etching process involves a chemical reaction which results in an accelerated etching rate, but since this process depends on the direction of the ionic species by the electric field, lateral etching under masks is minimal and nearly vertical etch steps are achieved. Since many complex and competing reactions can occur in the highly energized plasma surrounding the samples to be etched, reactive ion etching is a complex process. In this invention, the ambient in a sputter etching apparatus is provided such that a reaction occurs between the ionic species and the material being etched. It has been discovered when etching aluminum if the ambient contains chlorine or bromine ions or complex halide ions, aluminum chloride or aluminum bromide compounds will form and the reacted compounds are volatile at the temperature and pressure involved in the reactive ion etching process.

Referring now to FIG. 1, there is illustrated somewhat schematically a preferred ion etching apparatus 10 for practicing the subject process of the invention. Apparatus 10 includes a chamber having therein a substrate support electrode 12 for supporting substrates to be etched. The chamber itself consists of a bottom plate 16 of conductive material, a cylindrical wall 18 supported on plate 16, made either of glass or metal, and a top plate 20 which can be either integral with wall 18 or a separate unit. Preferably, 20 is supported on wall 18 and is made of a conductive material. Seals 22 insure a vacuum-tight joint between plates 16 and wall 18 and plate 20. Either plates 20 or plate 16, or both, are provided with a suitable ground 21. Electrode 12 is conventional and consists of an electrode element 24 of a suitable conductive material, and annular insulating element 26 of a suitable dielectric material which supports electrode element 24 and insulates it from base plate 16 and shield 28. If desired, element 24 can be provided with a suitable fluid cooling means which includes a concentrically disposed tube 29 in the hollow stem which either introduces or withdraws a cooling fluid from the hollow portion of element 24 underlying the top surface. As indicated by arrows 30 and 31, cooling fluid can be circulated to provide cooling. Also, if desired, the electrode 12 can be provided with a means of heating by placing suitable resistance heaters near the back of electrodes. Heating is advantageous when etching aluminum alloys. Substrates S rest on a glass or other dielectric plate 32 in turn supported on the top surface of electrode 24. RF power source 34 is connected to electrode element 24 through a capacitor 35. Capacitor 35 blocks the flow of dc current but does not impede alternating current of the frequency produced by source 34. Plate 16 and any other conductive surface at ground potential serves as the second electrode in the chamber. Chamber 10 is evacuated by vacuum pump 36. Gases are introduced into the chamber through inlets 38 and 43. Sources 40 and 42 of gas are connected by suitable lines and valves 38 and 43 to chamber 10.

Figure 2:
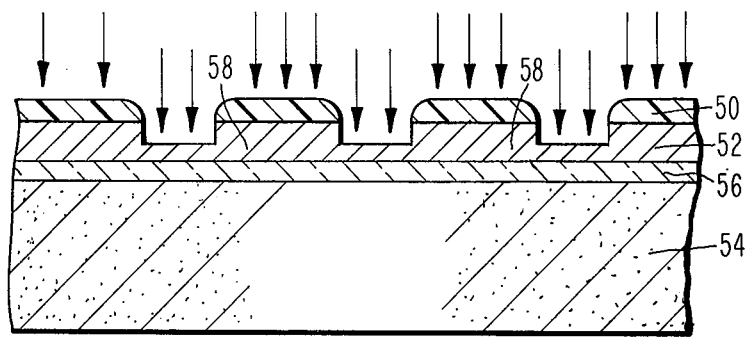
FIG. 2 is an elevational view in broken section illustrating a semiconductor device with a layer of aluminum that is partially etched by the method of the subject invention.

Referring now to FIG. 2, the process of the invention for the selective removal of aluminum is illustrated. In the process, a masking layer 50 is deposited on the surface of aluminum layer 52. Aluminum layer 52 is deposited by vapor plating, sputter deposition, or any other suitable technique on the surface of a substrate. It is understood that aluminum as described in this specification includes aluminum alloys which may be used to improve the metallurgy characteristics. For example, copper in amounts from one to eight percent has been added to aluminum to increase its electromigration resistance. Also, silicon in small amounts has been added to prevent silicon depletion of shallow junctions. The substrate is conventionally a monocrystalline semiconductor substrate 54 provided with an overlying dielectric layer 56. In fabricating integrated circuit semiconductor devices, the substrate 54 will conventionally have fabricated therein various active and passive devices which are not illustrated in FIG. 2 since it does not constitute part of the invention. The surface of the semiconductor is covered by at least one layer 56 of dielectric material which has via openings providing contacts to the aforementioned devices in the substrate. Masking layer 50 is formed usually using photolithographic techniques to delineate or cover the desired metallurgy pattern to be formed in layer 52. Masking layer 50 can be a photoresist layer or alternately dielectric layers such as $SiO_2$, $Al_2O_3$, $Si_3N_4$, and the like. Masking layer 50 must have a significant resistance to the resultant plasma formed in the reactive ion etching apparatus during the reactive ion etching process. Substrates 54 are placed in the reactive ion etching apparatus 10 as indicated in FIG. 1 and designated by S. A sputtering ambient is subsequently formed in the chamber of the reactive ion etching apparatus which ambient includes gas such as $CCl_4$, HCl, $Cl_2$, $CBr_4$, HBr, $Br_2$, or $I_2$. The gas has a relatively low pressure in the ion etching chamber typically from five to 50 milli torr. The ambient can consist of 100 percent of the aforementioned gases or only a portion thereof, with the balance of the gas being an inert gas. Preferably, the partial pressure of the aforementioned chloride and bromide gases is not less than ten percent of the total pressure. A preferred partial pressure range for the reactive gas is from 10 to 85 percent of the total pressure. The most preferred partial pressure of the reactive gas is 20 percent. A glow discharge is caused to form in the chamber containing the ion etching ambient by the application of an RF voltage from RF power source 34. While the ion etching can be accomplished using a dc power source provided that the conductive film 52 is connected to the electrode, an RF power source is preferred. The power applied to the electrode must be sufficiently high so that the substrate temperature maintains the vapor pressure of aluminum chloride, aluminum bromide or aluminum iodide at or above their respective sublimation pressures as will be explained hereinafter. The power density is in general in the range of 0.1 to 2 watt/cm², more preferably in the range of 0.2 to 0.4 watt/cm² of the electrode surface.

During the etching process, the electrode 12 and its associated elements are all bombarded by positive ions. In the process, the reactive ions also react with the unmasked and exposed portion of layer 52. In the immediate vicinity of the substrate there exists highly energized chlorine, bromine, iodine ions, or complex ions thereof, depending on the nature of the reactive gas. The aluminum and the chlorine, bromine or iodine ions react with each other to form an aluminum chloride, aluminum bromide, or aluminum iodide. Since the vapor pressure of these particular compounds exceeds their respective sublimation pressures, the compounds are vaporized into gas which can be conveniently exhausted. This leaves the surface relatively free of material that might otherwise impede the bombardment. Thus, the reactive ion etch rates are significantly increased as compared to sputtering in an inert ambient. Further, as indicated in FIG. 2, the sidewalls of the strips 58 shown partially etched are vertical. Reactive ion etch rates on the order of 6,000 Angstroms per minute have been achieved on aluminum films with an ambient having a total pressure of 20 millitorr and composed of eighty percent argon and twenty percent $CCl_4$ with a power density of 0.4W/cm².

While the invention has been particularly shown and described with reference to the preferred embodiments thereof, it will be understood by those skilled in the art that various changes in form and detail may be made therein without departing from the spirit and scope of the invention.

What is claimed is:

1. A process for selective removal of aluminum from the surface of a substrate having a dielectric coating and an overlying blanket layer of aluminum comprising:
   forming a masking layer over said aluminum layer that leaves exposed selected areas of said aluminum layer,
   exposing said masked substrate to a glow discharge in a low pressure ambient comprising a gas selected from the group consisting of $CCl_4$, HCl $Cl_2$, $CBr_4$, HBr, $Br_2$, $Cl_4$ and $I_2$ and mixtures thereof, said ambient having a pressure in the range of 5 to 50 milli-torr.

2. The process of claim 1 wherein said glow discharge is generated with an RF power source.

3. The process of claim 2 wherein said ambient is comprised of argon and $CCl_4$, the ratio of the partial pressure of argon to the partial pressure of $CCl_4$ being in the range of 0 to 9, said glow generated by an RF power density in the range of 0.2 to 0.4 watt/cm² of said substrate.

4. The process of claim 1 wherein said ambient further includes an inert gas selected from the group consisting of He and argon at a partial pressure from ten to eighty-five percent of the total pressure.

5. The process of claim 4 wherein said total pressure of said ambient is in the range of 5 to 25 milli-torr.

6. The process of claim 5 wherein the power density expended in generating said glow discharge is in the range of 0.1 to 2 watt/cm² of said substrate.

7. The process of claim 5 wherein the power density expended in generating said glow discharge is in the range of 0.2 to 0.4 watt/cm² of said substrate.

8. The process of claim 4 wherein said ambient includes $CCl_4$.

9. The process of claim 8 wherein said inert gas is argon.

* * * * *